(12) United States Patent
Chen (10) Patent No.: US 12,464,868 B2
(45) Date of Patent: Nov. 4, 2025

(54) DISPLAY SUBSTRATE AND METHOD FOR MANUFACTURING THE SAME

(71) Applicant: BOE Technology Group Co., Ltd., Beijing (CN)

(72) Inventor: Yuju Chen, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 558 days.

(21) Appl. No.: 17/627,737

(22) PCT Filed: Apr. 22, 2021

(86) PCT No.: PCT/CN2021/088950
§ 371 (c)(1),
(2) Date: Jan. 17, 2022

(87) PCT Pub. No.: WO2021/238517
PCT Pub. Date: Dec. 2, 2021

(65) Prior Publication Data
US 2022/0262985 A1    Aug. 18, 2022

(30) Foreign Application Priority Data
May 29, 2020 (CN) .......................... 202010473728.1

(51) Int. Cl.
*H10H 20/831*      (2025.01)
*H10H 20/01*       (2025.01)

(52) U.S. Cl.
CPC ........ *H10H 20/8316* (2025.01); *H10H 20/01* (2025.01); *H10H 20/032* (2025.01)

(58) Field of Classification Search
CPC . H01L 2224/13013; H01L 2224/13109; H01L 2224/13111; H01L 2224/13124;
(Continued)

(56) References Cited

U.S. PATENT DOCUMENTS 7,952,107 B2    5/2011  Daniels et al.
2006/0292824 A1* 12/2006 Beyne ..................... H01L 25/50
257/E21.705
(Continued)

FOREIGN PATENT DOCUMENTS

CN       102938432 A    2/2013
CN       108535928 A    9/2018
(Continued)

OTHER PUBLICATIONS

First Office Action dated Oct. 9, 2021 corresponding to Chinese application No. 202010473728.1.
(Continued)

*Primary Examiner* — Matthew C Landau
*Assistant Examiner* — Dmitriy Yemelyanov
(74) *Attorney, Agent, or Firm* — Nath, Goldberg & Meyer; Joshua B. Goldberg (57) ABSTRACT

The present disclosure provides a display substrate and a method for manufacturing the display substrate. The display substrate includes a base, a plurality of bonding electrodes disposed on the base and spaced apart from each other, and a plurality of functional devices on a side of the plurality of bonding electrodes away from the base. The plurality of bonding electrodes are coupled to electrodes of the plurality of functional devices by bonding. The display substrate further includes an isolation structure disposed on the base and between at least two adjacent bonding electrodes of the plurality of bonding electrodes.

17 Claims, 5 Drawing Sheets

(58) Field of Classification Search
CPC . H01L 2224/13144; H01L 2224/13147; H01L 2224/13155; H01L 2224/13166; H01L 2224/16257; H01L 2224/81001; H01L 2224/81193; H01L 2224/81399; H01L 2224/95001; H01L 24/13; H01L 24/16; H01L 24/81; H01L 24/95; H01L 25/0753; H01L 25/167; H01L 2924/00013; H01L 2924/00014; H01L 2924/013; H01L 2924/12041; H01L 2933/0016; H01L 2933/0066; H01L 33/005; H01L 33/387; H01L 33/62
See application file for complete search history.

(56) References Cited

U.S. PATENT DOCUMENTS

2014/0191258 A1* 7/2014 Akimoto ............ H01L 25/0753
438/29
2016/0143174 A1* 5/2016 Cho ..................... H05K 3/323
174/251
2018/0053808 A1* 2/2018 Chu ..................... H01L 33/44
2019/0131281 A1* 5/2019 Liu ...................... H01L 33/38

FOREIGN PATENT DOCUMENTS

| CN | 109087873 A | 12/2018 |
|---|---|---|
| CN | 109188790 A | 1/2019 |
| CN | 109888085 A | 6/2019 |
| CN | 110113026 A | 8/2019 |
| CN | 110544704 A | 12/2019 |
| CN | 110854151 A | 2/2020 |
| CN | 111599834 A | 8/2020 |

OTHER PUBLICATIONS

Second Office Action dated Feb. 8, 2022 corresponding to Chinese application No. 202010473728.1.

* cited by examiner

DISPLAY SUBSTRATE AND METHOD FOR MANUFACTURING THE SAME

CROSS-REFERENCE TO RELATED APPLICATION

This is a National Phase Application filed under 35 U.S.C. 371 as a national stage of PCT/CN2021/088950, filed on Apr. 22, 2021, an application claiming priority to Chinese patent application No. 202010473728.1, filed on May 29, 2020, the disclosure of each of which is incorporated herein by reference.

TECHNICAL FIELD

The present disclosure relates to the field of display technology, and in particular, to a display substrate and a method for manufacturing the same.

BACKGROUND

A micro light emitting diode (micro LED) display technology is a technology used for achieving miniaturization and matrixing of LEDs. In the micro LED display technology, an array of LEDs with a micro size are integrated on one chip at high density. For example, each pixel in an LED display screen using the micro LED display technology is addressable and can be separately driven to emit light, the LED display screen can be regarded as a miniature version of an outdoor LED display screen, and a distance between pixels is reduced from a millimeter scale to a micrometer scale.

SUMMARY

An embodiment of the present disclosure provides a display substrate, including a base, a plurality of bonding electrodes disposed on the base and spaced apart from each other, and a plurality of functional devices on a side of the plurality of bonding electrodes away from the base, and the plurality of bonding electrodes are coupled to electrodes of the plurality of functional devices by bonding, and the display substrate further includes an isolation structure disposed on the base and between at least two adjacent bonding electrodes of the plurality of bonding electrodes.

In some embodiments, the plurality of bonding electrodes are arranged on the base in a plurality of rows and a plurality of columns, the plurality of rows of bonding electrodes includes a plurality of rows of first electrodes and a plurality of rows of second electrodes, each row of first electrodes of the plurality of rows of first electrodes includes a plurality of first electrodes arranged in a row direction, each row of second electrodes of the plurality of rows of second electrodes includes a plurality of second electrodes arranged in the row direction, and the plurality of rows of first electrodes and the plurality of rows of second electrodes are alternately arranged in a column direction such that each column of bonding electrodes of the plurality of bonding electrodes includes a plurality of first electrodes and a plurality of second electrodes alternately arranged;

each functional device includes a body, a positive electrode and a negative electrode, and the positive electrode and the negative electrode protrude from a first surface of the body to an outside of the body;

each first electrode is coupled to a corresponding positive electrode by bonding, and each second electrode is coupled to a corresponding negative electrode by bonding; and the isolation structure includes a first isolation pattern disposed between at least one first electrode and at least one second electrode adjacent to each other.

In some embodiments, the isolation structure includes the first isolation pattern disposed between at least two adjacent rows of bonding electrodes of the plurality of rows of bonding electrodes, and the first isolation pattern extends in the row direction.

In some embodiments, the isolation structure includes a plurality of first isolation patterns disposed between any two adjacent rows of bonding electrodes of plurality of rows of bonding electrodes, and each first isolation pattern extends in the row direction.

In some embodiments, at least one first isolation pattern is in contact with a row of first electrodes and a row of second electrodes adjacent to the at least one first isolation pattern, and a cross section of at least one first isolation pattern perpendicular to the row direction includes an inverted trapezium.

In Some Embodiments, the Positive Electrode and the Negative Electrode Protrude Outward from the First Surface of the Body by a Same Thickness;

the first electrode and the second electrode have a same thickness in a vertical direction perpendicular to the row direction and the column direction; and the thickness of the positive electrode protruding outward from the first surface of the body is greater than a thickness of the plurality of first isolation patterns in the vertical direction, and the thickness of the plurality of first isolation patterns in the vertical direction is greater than the thickness of the first electrode in the vertical direction.

In some embodiments, a width of the positive electrode in the column direction is equal to a width of the negative electrode in the column direction;

a width of the first electrode in the column direction is equal to a width of the second electrode in the column direction;

the width of the positive electrode in the column direction is greater than or equal to the width of the first electrode in the column direction; and a distance between surfaces of at least two adjacent first isolation patterns away from the base in the column direction is smaller than the width of the first electrode in the column direction.

In some embodiments, a surface of at least one first isolation pattern away from the base and a side surface of the at least one first isolation pattern adjacent to the surface of the at least one first isolation pattern away from the base form a chamfer, and the chamfer ranges from 45° to 90°.

In some embodiments, a cross section of each first isolation pattern perpendicular to the row direction includes a rectangle.

In some embodiments, a width of each first isolation pattern in the column direction is equal to a distance between the positive electrode and the negative electrode, and is greater than a distance between the bodies of any two adjacent functional devices in the column direction.

In some embodiments, the positive electrode and the negative electrode protrude outward from the first surface of the body by a same thickness;

the first electrode and the second electrode have a same thickness in a vertical direction perpendicular to the row direction and the column direction; and a thickness of the plurality of first isolation patterns in the vertical direction, the thickness of the positive electrode and the negative electrode protruding outward from the first surface of the body, and the thickness of the first electrode and the second electrode in the vertical direction satisfy: d1=(d2+d3)*[1+ (P/W)], d1 is the thickness of the plurality of first isolation patterns in the vertical direction, d2 is the thickness of the first electrode and the second electrode in the vertical direction, d3 is the thickness of the positive electrode and the negative electrode protruding outward from the first surface of the body, P is a warpage value of a carrier board carrying the plurality of functional devices, and W is a width of the carrier board carrying the plurality of functional devices in the column direction.

In some embodiments, the isolation structure further includes a plurality of second isolation patterns disposed on the base and alternately arranged with the plurality of columns of bonding electrodes;

the plurality of second isolation patterns extend in the column direction and form a plurality of grooves by crossing the plurality of first isolation patterns, and the plurality of bonding electrodes are respectively located in the plurality of grooves; and the plurality of second isolation patterns have a same shape as the plurality of first isolation patterns.

In some embodiments, each of the plurality of bonding electrodes includes a first sub-layer and a second sub-layer sequentially stacked on the base, and the second sub-layer is melted when the bonding electrode is bonded; and each of the electrodes of the plurality of functional devices includes a third sub-layer protruding from a body of the functional device and a fourth sub-layer stacked on the third sub-layer, and the fourth sub-layer is melted when the electrode of the plurality of functional devices is bonded.

In some embodiments, each of the first sub-layer and the third sub-layer includes one of titanium, copper, nickel, and a metal alloy formed by any two of them; and each of the second sub-layer and the fourth sub-layer includes one of gold, aluminum, tin, indium, and a metal alloy formed by any two or three of them.

An embodiment of the present disclosure further provides a method for manufacturing a display substrate, including:

forming, on a base, a plurality of bonding electrodes spaced apart from each other;

forming an isolation structure on the base and between at least two adjacent bonding electrodes of the plurality of bonding electrodes;

forming a plurality of functional devices; and coupling electrodes of the plurality of functional devices to the plurality of bonding electrodes by bonding.

In some embodiments, forming the isolation structure includes forming a first isolation pattern.

In some embodiments, the method for manufacturing the display substrate according to an embodiment of the present disclosure further includes:

performing a drying process on the first isolation pattern while performing the step of coupling the electrodes of the plurality of functional devices to the plurality of bonding electrodes by bonding.

In some embodiments, the first isolation pattern is subjected to a drying process, and then the step of coupling the electrodes of the plurality of functional devices to the plurality of bonding electrodes by bonding is performed.

In some embodiments, forming the isolation structure includes forming a first isolation pattern;

forming each of the plurality of functional devices includes forming a body, a positive electrode and a negative electrode; and coupling the electrodes of the plurality of functional devices to the plurality of bonding electrodes by bonding includes:

aligning the positive electrode and the negative electrode with corresponding bonding electrodes of the plurality of bonding electrodes, respectively;

adhering the base to the body by using the first isolation pattern as an adhesive; and coupling the positive electrode and the negative electrode to the corresponding bonding electrodes by bonding.

In some embodiments, coupling the positive electrode and the negative electrode to the corresponding bonding electrodes by bonding includes: coupling the positive electrode and the negative electrode to the corresponding bonding electrodes by bonding by a nitrogen tempering process.

DETAIL DESCRIPTION OF EMBODIMENTS

To make those skilled in the art better understand the technical solutions of the present disclosure, a display substrate and a method of manufacturing the display substrate according to the present disclosure are further described in detail below with reference to the drawings and the specific embodiments.

For a current micro LED mass transfer technology, a plurality of micron-scale LED chips need to be bonded to a backplane provided with a transistor driving circuit. For example, a cathode or an anode of a micro LED chip is bonded to an electrode included in the backplane. The bonding of electrodes is generally implemented by a conductive adhesive, and the conductive adhesive includes a conductive gold ball which couples the electrodes together by bonding. However, electrodes in a size less than 20 μm cannot have a low resistance after being bonded by the conductive adhesive. Therefore, a eutectic bonding process is currently used to bond the electrodes instead of the conductive adhesive. However, during bonding, the electrodes may melt and flow, resulting in a short circuit between the cathode and the anode of the micro LED chip.

Figure 1:
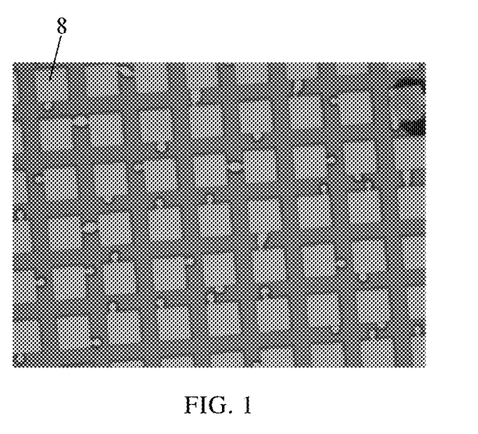
FIG. 1 is a schematic top view of a micro LED chip in which a eutectic bonding process is used to bond electrodes.

Currently, the eutectic bonding process is used to bond a plurality of micron-scale micro LED chips to a backplane provided with a transistor driving circuit. Generally, an LED chip provided with a horizontal electrode has a large size and has a large distance between a cathode and an anode thereof, so that a problem of a short circuit caused by electrode melting and flowing is not generated when electrode bonding is performed by the eutectic bonding process. However, as shown in FIG. 1, since a size of the micro LED chip is reduced to the micron scale and a distance between the chips is small, an electrode 8 (including the cathode and the anode of the micro LED chip and/or the electrode included in the backplane) may melt and flow during the process of performing electrode bonding by the eutectic bonding process, resulting in a short circuit between the cathode and the anode of the micro LED chip.

In the eutectic bonding process, at least a surface layer of a to-be-bonded electrode includes a metal capable of melting at a certain temperature, such as gold, tin, indium and the like. When bonding is performed, the surface layers of to-be-bonded electrodes melt at a certain temperature and react with each other to form a metal alloy, thereby achieving the coupling of the electrodes by bonding.

Figure 2:
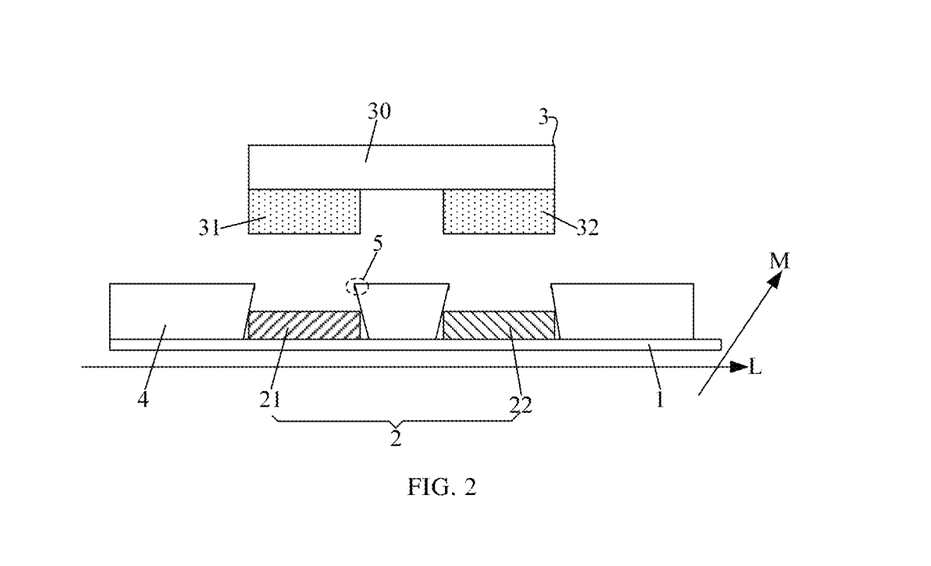
FIG. 2 is a partial sectional view of a display substrate when bonding electrodes are bonded to electrodes of functional devices according to an embodiment of the present disclosure.
Figure 3:
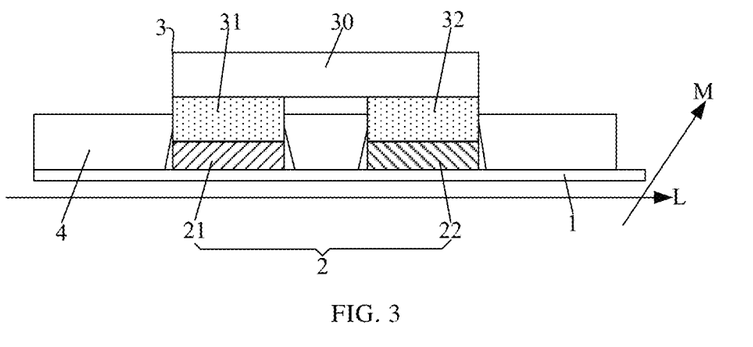
FIG. 3 is a partial sectional view of the display substrate after the bonding electrodes are bonded to the electrodes of the functional devices in FIG. 2.
Figure 4:
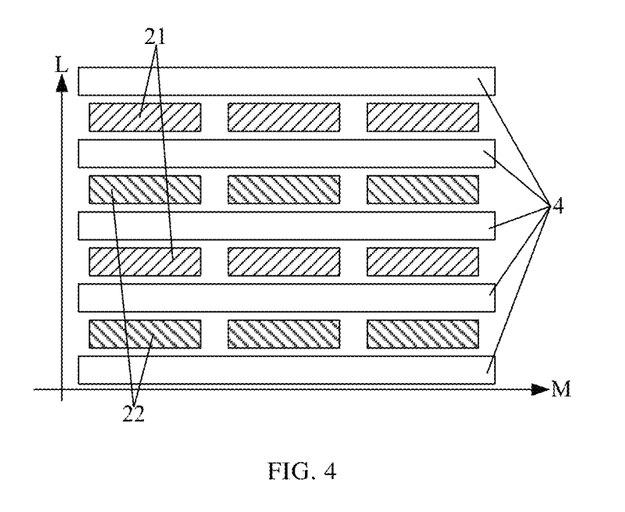
FIG. 4 is a schematic partial top view of a display substrate according to an embodiment of the present disclosure.

FIG. 2 is a partial sectional view of a display substrate when bonding electrodes are bonded to electrodes of functional devices according to an embodiment of the present disclosure. FIG. 3 is a partial sectional view of the display substrate after the bonding electrodes are bonded to the electrodes of the functional devices in FIG. 2. FIG. 4 is a schematic partial top view of a display substrate according to an embodiment of the present disclosure.

As shown in FIG. 2 to FIG. 4, a display substrate according to an embodiment of the present disclosure includes a base 1, a plurality of bonding electrodes 2 (e.g., 21 and 22), and a plurality of functional devices 3. The bonding electrodes 2 are disposed on the base 1 and are spaced apart from each other, the functional devices 3 are located on a side of the bonding electrodes 2 away from the base 1, and the bonding electrodes 2 are coupled to electrodes (e.g., 31 and 32) of the functional devices 3 by bonding. The display substrate according to the embodiment of the present disclosure further includes an isolation structure disposed on the base 1, and the isolation structure is disposed between at least two adjacent ones of the bonding electrodes 2.

In the embodiments of the present disclosure, the functional device 3 may include any device which needs to couple an electrode thereof to another base, such as a light emitting diode included in the display substrate, a sensor for touch detection, or the like.

By providing the isolation structure, flow of melted electrodes between the adjacent bonding electrodes 2 can be blocked when electrode bonding is performed by the eutectic bonding process, so as to prevent a short circuit between adjacent bonding electrodes 2 and between the electrodes of the functional device 3 due to electrode melting and flowing, thereby improving an electrode bonding quality of the display substrate and a quality of the display substrate.

In an embodiment of the present disclosure, as shown in FIG. 2 to FIG. 4, the plurality of bonding electrodes 2 are arranged on the base 1 in a plurality of rows and a plurality of columns. The plurality of rows of bonding electrodes 2 include a plurality of rows of first electrodes 21 and a plurality of rows of second electrodes 22, each row of first electrodes 21 of the plurality of rows of first electrodes 21 includes a plurality of first electrodes 21 arranged in a row direction, each row of second electrodes 22 of the plurality of rows of second electrodes 22 includes a plurality of second electrodes 22 arranged in the row direction, and the plurality of rows of first electrodes 21 and the plurality of rows of second electrodes 22 are alternately arranged in a column direction such that each column of bonding electrodes 2 of the plurality of bonding electrodes 2 includes a plurality of first electrodes 21 and a plurality of second electrodes 22 arranged alternately. In an embodiment of the present disclosure, as shown in FIG. 2 to FIG. 4, the column direction is a first direction L, and the row direction is a second direction M. Each of the functional devices 3 may include a body 30, a positive electrode 31 and a negative electrode 32, and the positive electrode 31 and the negative electrode 32 may protrude from a same surface of the body 30 to an outside of the body 30. Each first electrode 21 is coupled to a corresponding positive electrode 31 by bonding, and each second electrode 22 is coupled to a corresponding negative electrode 32 by bonding.

In some embodiments, the isolation structure may include a first isolation pattern 4 disposed between at least one first electrode 21 and at least one second electrode 22 adjacent to each other. The first isolation pattern 4 extends in the second direction M.

In some embodiments, the isolation structure may include a first isolation pattern 4 disposed between at least two adjacent rows of bonding electrodes 2 of the plurality of rows of bonding electrodes 2, and the first isolation pattern 4 extends in the second direction M.

In some embodiments, as shown in FIG. 2 to FIG. 4, the isolation structure may include a plurality of first isolation patterns 4 disposed between any two adjacent rows of bonding electrodes 2 of the plurality of rows of bonding electrodes 2, respectively, and each of the first isolation patterns 4 extends in the second direction M. In this case, in some embodiments, each row of bonding electrodes 2 is disposed between two adjacent first isolation patterns 4. That is, in some embodiments, one first isolation pattern 4 is disposed outside an outermost row of bonding electrodes 2 such that the outermost row of bonding electrodes 2 is clamped between two adjacent first isolation patterns 4.

In some embodiments, the plurality of rows of bonding electrodes 2 are arranged at a same interval, the plurality of columns of bonding electrodes 2 are arranged at a same interval, and the plurality of first isolation patterns 4 are arranged at a same interval.

In some embodiments, the body 30 includes a part (such as a part of the light emitting diode for emitting light) of the functional device 3 except the electrodes (e.g., 31 and 32).

In some embodiments, the first isolation pattern 4 may include polyimide, polycarbonate (PC), and the like, and the first isolation pattern 4 has a certain elasticity and deformability. In some embodiments, the first isolation pattern 4 may be implemented by photoresist. The first isolation pattern 4 may prevent or suppress flow of melted first electrode 21 and second electrode 22 when electrode bonding is performed by the eutectic bonding process, so that a short circuit between the first electrode 21 and the second electrode 22 and between the positive electrode 31 and the negative electrode 32 of the functional device 3 may be prevented.

In some embodiments, at least one first isolation pattern 4 is in contact with a row of first electrodes 21 and a row of second electrodes 22 adjacent to the at least one first isolation pattern 4, and a cross section of the at least one first isolation pattern 4 perpendicular to the second direction M includes an inverted trapezium. In some embodiments, as shown in FIG. 2 to FIG. 4, each first isolation pattern 4 is in contact with a row of first electrodes 21 and a row of second electrodes 22 adjacent to the first isolation pattern 4, and a cross section of each first isolation pattern 4 perpendicular to the second direction M includes an inverted trapezium. The first isolation patterns 4 in the shape of inverted trapezium enable adjacent first isolation patterns 4 to well accommodate the melted electrodes (e.g., the bonding electrodes 2 and/or the electrodes of the functional devices 3) therebetween, so that the flow of the melted electrodes towards the bonding electrodes 2 adjacent thereto may be effectively blocked. In addition, the first isolation patterns 4 in the shape of inverted trapezium enable the first isolation patterns 4 to firmly clamp the first electrode 21 and the positive electrode 31 which are bonded, and the second electrode 22 and the negative electrode 32 which are bonded, thereby ensuring good contact and firm bonding between the first electrode 21 and the positive electrode 31 and between the second electrode 22 and the negative electrode 32.

In an embodiment of the present disclosure, as shown in FIG. 2 to FIG. 4, the positive electrode 31 and the negative electrode 32 protrude outward from the surface of the body 30 by a same thickness, the first electrode 21 and the second electrode 22 have a same thickness in a third direction perpendicular to the first direction L and the second direction M, the thickness of the positive electrode 31 protruding outward from the surface of the body 30 is greater than the thickness of the first isolation pattern 4 in the third direction, and the thickness of the first isolation pattern 4 in the third direction is greater than the thickness of the first electrode 21 in the third direction. The positive electrodes 31 and the negative electrodes 32 protrude outward from the surfaces of the bodies 30 by the same thickness such that the electrodes of the respective functional devices 3 form a flat surface, the first electrodes 21 and the second electrodes 22 have the same thickness in the third direction such that the respective bonding electrodes 2 form a flat surface, and thus the bonding between the electrodes of the functional devices 3 and the bonding electrodes 2 is implemented as bonding between the electrodes forming flat surfaces. The thicknesses of the electrodes of the functional device 3, the bonding electrodes 2 and the first isolation pattern 4 enable melted surface layers of the bonding electrodes 2 and/or the electrodes of the functional device 3 to fill a space between the first isolation pattern 4 and the first electrode 21 and a space between the first isolation patterns 4 and the second electrode 22 when the positive electrode 31 is bonded to the first electrode 21 and the negative electrode 32 is bonded to the second electrode 22, thereby achieving good contact and bonding between the electrodes. In addition, since a sum of the thicknesses of the first electrode 21 and the positive electrode 31 is greater than the thickness of the first isolation pattern 4, and a sum of the thicknesses of the second electrode 22 and the negative electrode 32 is greater than the thickness of the first isolation pattern 4, parts of the positive electrode 31 and the negative electrode 32 are exposed outside the first isolation pattern 4 after the electrode bonding. In this case, the first isolation patterns 4 may well clamp and firmly fix the bonded electrodes, and the bonding between the electrodes is firmer.

In an embodiment of the present disclosure, as shown in FIG. 2 to FIG. 4, a width of the positive electrode 31 in the first direction L is equal to that of the negative electrode 32 in the first direction L, a width of the first electrode 21 in the first direction L is equal to that of the second electrode 22 in the first direction L, and the width of the positive electrode 31 in the first direction L is greater than or equal to that of the first electrode 21 in the first direction L. In some embodiments, a distance between surfaces of at least two adjacent first isolation patterns 4 away from the base 1 in the first direction L is smaller than the width of the first electrode 21 in the first direction L. In some embodiments, as shown in FIG. 2 and FIG. 3, a distance between surfaces of any two adjacent first isolation patterns 4 away from the base 1 in the first direction L is smaller than the width of the first electrode 21 in the first direction L. In this case, during bonding, each positive electrode 31 is embedded in a space formed by two adjacent first isolation patterns 4 respectively on both sides of a first electrode 21 corresponding to the positive electrode 31, and each negative electrode 32 is embedded in a space formed by two adjacent first isolation patterns 4 respectively on both sides of a second electrode 22 corresponding to the negative electrode 32. Each of the positive electrode 31 and the negative electrode 32 is embedded in a space formed by the first isolation patterns 4 so that the melted electrodes do not flow to adjacent bonding electrodes 2, thereby preventing a short circuit between the adjacent bonding electrodes 2 and between the positive electrode 31 and the negative electrode 32. Parts of the adjacent first isolation patterns 4 away from the base 1 may generate compressive stress for firmly clamping and fixing the electrodes (e.g., the positive electrode 31 or the negative electrode 32) therebetween, so that stability and reliability of the electrode bonding can be ensured, and the bonded electrodes can be prevented from being detached from each other.

In an embodiment of the present disclosure, as shown in FIG. 2 and FIG. 3, a chamfer 5 is formed by a surface of a first isolation pattern 4 away from the base 1 and a side surface of the first isolation pattern 4 adjacent to the surface of the first isolation pattern 4 away from the base 1, and the chamfer 5 ranges from 45° to 90°. Chamfers 5 enable the parts of the adjacent first isolation patterns 4 away from the base 1 to clamp the electrodes (e.g., the positive electrode 31 and the negative electrode 32) therebetween by being in area contact with the electrodes. The area contact has relatively strong frictional force and adhesion, so the stability and the reliability of the electrode bonding can be further ensured and the bonded electrodes can be further prevented from being detached from each other.

In some embodiments, as shown in FIG. 4, the plurality of first isolation patterns 4 included in the isolation structure are alternately arranged with the plurality of rows of bonding electrodes 2 in the first direction L, and two outermost rows of bonding electrodes 2 are between two outermost first isolation patterns 4. When viewed in a plan view, each first isolation pattern 4 is in a shape of stripe and extends in the second direction M.

Figure 5:
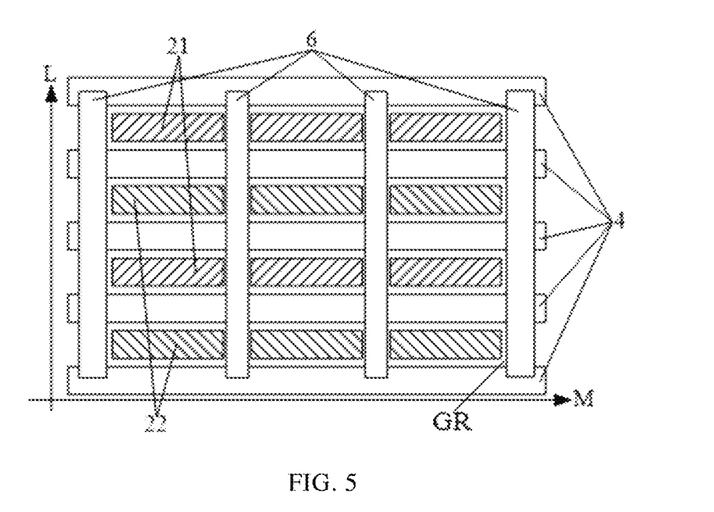
FIG. 5 is a schematic partial top view of a display substrate according to another embodiment of the present disclosure.

In some embodiments, as shown in FIG. 5, the isolation structure further includes a plurality of second isolation patterns 6 disposed on the base 1 and alternately arranged with the plurality of columns of bonding electrodes 2. In this case, in some embodiments, the plurality of second isolation patterns 6 are alternately arranged with the plurality of columns of bonding electrodes 2 in the second direction M, and two outermost columns of bonding electrodes 2 are between two outermost second isolation patterns 6.

In an embodiment of the present disclosure, the plurality of second isolation patterns 6 extend in the first direction L and form a plurality of grooves GR_by crossing the plurality of first isolation patterns 4. The first electrodes 21 and the second electrodes 22 are in the plurality of grooves GR, respectively. That is, when viewed in a plan view, the isolation structure is in a shape of mesh. The isolation structure in the shape of mesh can further prevent the flow of the melted electrodes during bonding, so that a short circuit between the bonded electrodes can be further prevented.

In an embodiment of the present disclosure, the second isolation pattern 6 may have a same shape as the first isolation pattern 4. That is, a cross section of the second isolation pattern 6 perpendicular to the first direction L may include an inverted trapezium, and the second isolation pattern 6 may be in a shape of stripe when viewed in a plan view. In addition, the second isolation pattern 6 may be made of a same material as the first isolation pattern 4. In some embodiments, the plurality of second isolation patterns 6 are arranged at a same interval.

In some embodiments, each bonding electrode 2 includes a first sub-layer and a second sub-layer sequentially stacked on the base 1, and the second sub-layer is melted when the electrode bonding is performed; and each electrode of the functional device 3 includes a third sub-layer protruding from the body 30 and a fourth sub-layer stacked on the third sub-layer, and the fourth sub-layer is melted when the electrode bonding is performed. Each of the first sub-layer and the third sub-layer includes one of titanium, copper, nickel, and a metal alloy formed by any two of them, and each of the second sub-layer and the fourth sub-layer includes one of gold, aluminum, tin, indium, and a metal alloy formed by any two or three of them.

In some embodiments, the plurality of bonding electrodes 2 have a same size and a same shape.

In some embodiments, the plurality of functional devices 3 have a same size and a same shape, and the positive electrode and the negative electrode of each functional device 3 have a same size and a same shape.

Figure 9:
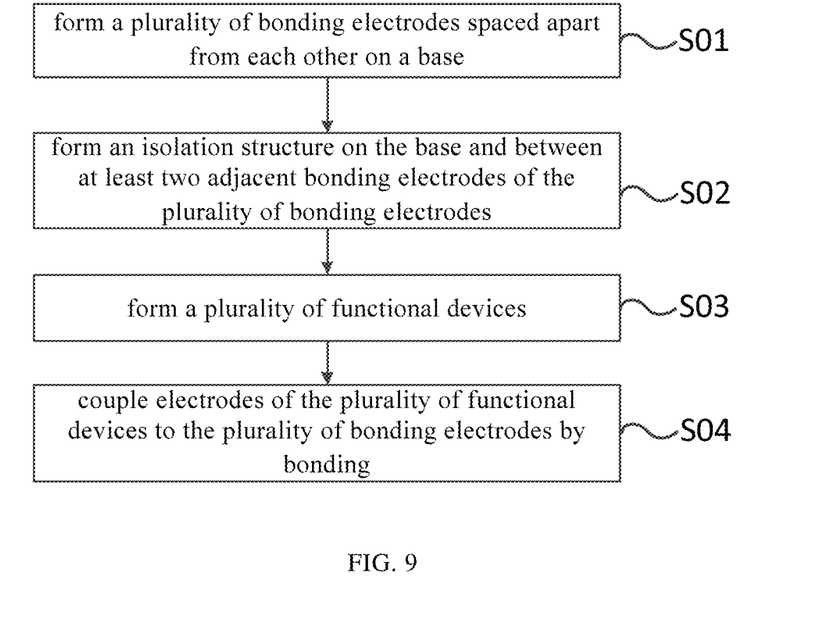
FIG. 9 illustrates a method for manufacturing a display substrate according to an embodiment of the present disclosure.

FIG. 9 illustrates a method for manufacturing a display substrate according to an embodiment of the present disclosure.

As shown in FIG. 9, a method for manufacturing a display substrate according to an embodiment of the present disclosure includes the following steps S01 to S04.

In step S01, a plurality of bonding electrodes spaced apart from each other are formed on a base.

In step S02, an isolation structure is formed on the base and between at least two adjacent bonding electrodes of the plurality of bonding electrodes.

In step S03, a plurality of functional devices are formed.

In step S04, electrodes of the plurality of functional devices are coupled to the plurality of bonding electrodes by bonding.

In some embodiments, forming the isolation structure includes forming a first isolation pattern.

In some embodiments, a drying process may be performed on the first isolation pattern while the step S04 is performed. That is, the drying process may be performed on the first isolation pattern while the electrodes are bonded through a eutectic bonding process. In this case, a material for forming the first isolation pattern may have a curing temperature substantially the same as a temperature at which electrode bonding is performed.

In some embodiments, the drying process may be performed on the first isolation pattern, and then the step S04 is performed. That is, the drying process may be performed on the first isolation pattern to cure the first isolation pattern, and then the electrodes may be bonded through, for example, a eutectic bonding process. Since it takes about 1 to 2 minutes to bond electrodes and it takes about 20 to 30 minutes to perform the drying process on the first isolation pattern to cure the first isolation pattern, the bonding of electrodes does not substantially affect the cured first isolation pattern. In this case, a material for forming the first isolation pattern may have a curing temperature substantially the same as a temperature at which electrode bonding is performed.

In the embodiments of the present disclosure, any known and suitable process may be used to form the functional device.

In some embodiments, forming the plurality of functional devices may include forming a plurality of light emitting diodes on a second base. In this case, coupling the electrodes of the plurality of functional devices to the plurality of bonding electrodes by bonding may include: transferring the plurality of light emitting diodes to the base formed with the plurality of bonding electrodes by a carrier board, so that electrodes of the plurality of light emitting diodes are coupled to the plurality of bonding electrodes on the base by bonding. In this case, in some embodiments, the method for manufacturing the display substrate according to the embodiment of the present disclosure may further include a step S05. In step S05, the carrier board is stripped from the plurality of light emitting diodes.

In the method for manufacturing the display substrate according to the embodiment of the present disclosure, the plurality of bonding electrodes may be formed by any known and suitable patterning process (e.g., including the steps of film formation, exposure, development, etching, etc.), and the isolation structure may be formed by any known and suitable patterning process (including the steps of film coating, exposure, development, etc.).

In some embodiments, the plurality of bonding electrodes are arranged on the base in a plurality of rows and a plurality of columns.

In some embodiments, the isolation structure may include a first isolation pattern disposed between at least two adjacent rows of bonding electrodes of the plurality of rows of bonding electrodes.

In some embodiments, the isolation structure may include a plurality of first isolation patterns respectively disposed between any two adjacent rows of bonding electrodes of the plurality of rows of bonding electrodes.

In some embodiments, the first isolation pattern may have a cross section in a shape of inverted trapezium.

Figure 6:
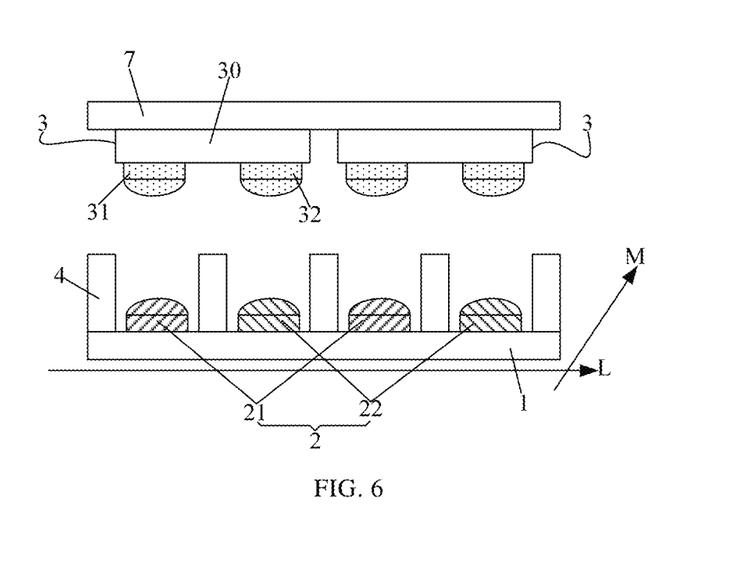
FIG. 6 is a partial sectional view of a display substrate when bonding electrodes are bonded to electrodes of functional devices according to another embodiment of the present disclosure.
Figure 7:
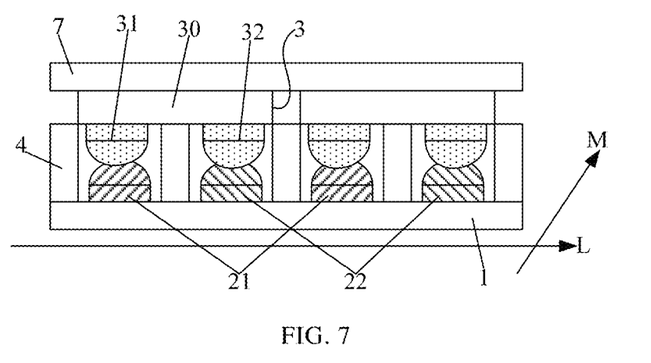
FIG. 7 is a partial sectional view of the display substrate after the bonding electrodes are bonded to the electrodes of the functional devices in FIG. 6.
Figure 8:
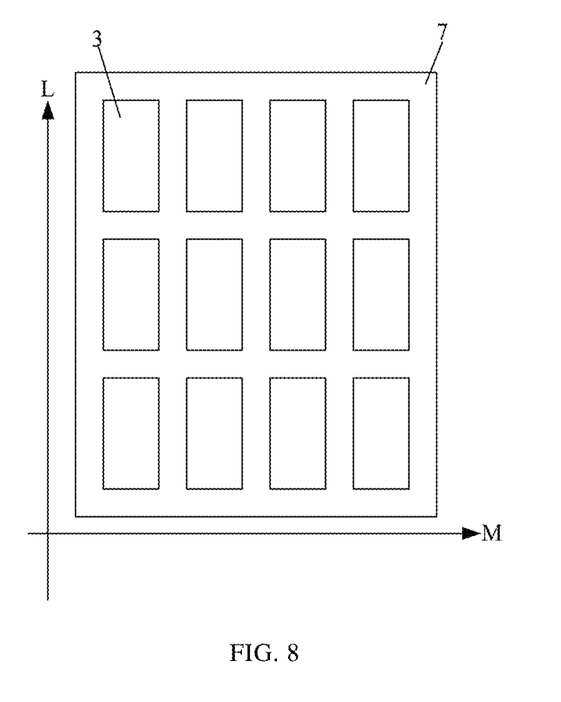
FIG. 8 is a schematic top view of a carrier board carrying functional devices according to an embodiment of the present disclosure.
Figure 10:
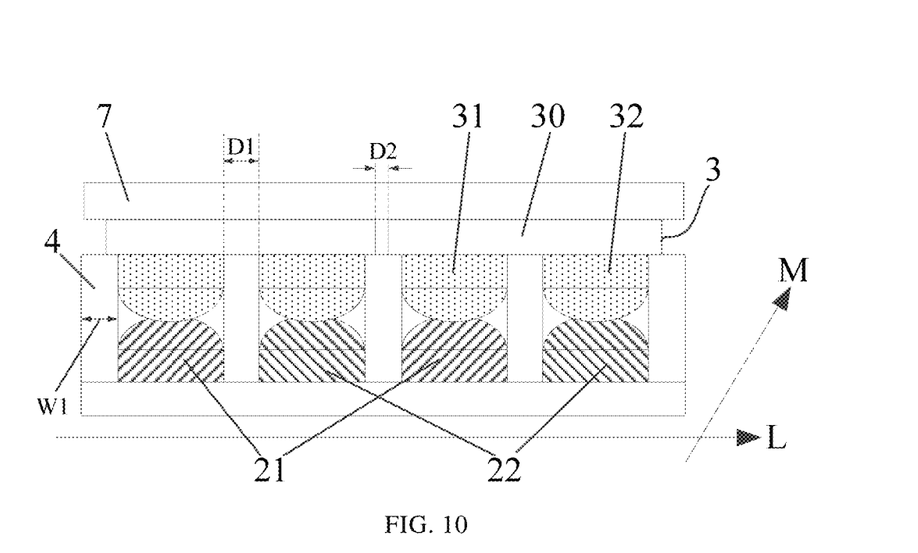
FIG. 10 is a partial sectional view of the display substrate after the bonding electrodes are bonded to the electrodes of the functional devices.

FIG. 6 is a partial sectional view of a display substrate when bonding electrodes are bonded to electrodes of functional devices according to another embodiment of the present disclosure. FIG. 7 is a partial sectional view of the display substrate after the bonding electrodes are bonded to the electrodes of the functional devices in FIG. 6. FIG. 8 is a schematic top view of a carrier board carrying functional devices according to an embodiment of the present disclosure. To avoid redundancy, differences between the display substrate in the embodiment and the display substrate in the previous embodiments are mainly described below. FIG. 10 is a partial sectional view of the display substrate after the bonding electrodes are bonded to the electrodes of the functional devices.

As shown in FIG. 6 to FIG. 8, a cross section of the first isolation pattern 4 perpendicular to the second direction M may include a rectangle. The positive electrode 31 and the negative electrode 32 protrude outward from the surface of the body by a same thickness, and the first electrode 21 and the second electrode 22 have a same thickness in the third direction. A thickness of the first isolation pattern 4 in the third direction, the thickness of the positive electrode 31 and the negative electrode 32 protruding outward from the surface of the body 30, and the thickness of the bonding electrodes 2 in the third direction satisfy: $d1=(d2+d3)*[1+(P/W)]$. $d1$ is the thickness of the first isolation pattern 4 in the third direction, $d2$ is the thickness of the first electrode 21 and the second electrode 22 in the third direction, $d3$ is the thickness of the positive electrode 31 and the negative electrode 32 protruding outward from the surface of the body 30, P is a warpage value of a carrier board 7 carrying the functional devices 3, and W is a width of the carrier board 7 carrying the functional devices 3 in the first direction L.

When the electrodes of the functional devices 3 are bonded to the bonding electrodes 2, the carrier board 7 is used to carry the functional devices 3, and a large number of functional devices 3 are transferred to the base formed with the bonding electrodes 2 by the carrier board 7 so that the electrodes of the functional devices 3 are coupled to the bonding electrodes 2 by bonding. Since the carrier board 7 has a certain degree of warpage, a surface of the carrier board 7 carrying the functional devices 3 is not flat, which affects the transfer of the large number of functional devices 3. When the thickness of the first isolation patterns 4, the thickness of the electrodes of the functional devices 3 and the thickness of the bonding electrodes 2 satisfy the above formula, the surface of the carrier board 7 carrying the functional devices 3 is substantially flat, thereby facilitating the transfer of the large number of functional devices 3. In the above formula, P/W is a unitless quantity, and 1+ (P/W) may be used as a correction factor to correct the thickness $d1$ of the first isolation pattern 4.

In addition, when the electrodes of the functional devices 3 are bonded to the bonding electrodes 2, the thickness of the first isolation patterns 4 satisfies the above formula such that the base and the functional devices 3 may be bonded together, and melted electrodes may fill the space between the first isolation patterns 4. Therefore, in a case where the surface of the carrier board 7 carrying the functional devices 3 is uneven and warped, the electrodes of the functional devices 3 may be well bonded to the bonding electrodes 2. In this case, the first isolation patterns 4 may also prevent the flow of the melted electrodes, so that a short circuit between the bonded electrodes may be prevented.

In the embodiments of the present disclosure, a cross section of the first isolation pattern 4 perpendicular to the second direction M may include an inverted trapezium. Therefore, any two adjacent first isolation patterns 4 can well accommodate the melted electrodes therebetween, prevent flow of the melted electrodes towards the adjacent bonding electrodes 2, and may firmly clamp the first electrodes 21 and the positive electrodes 31 bonded to each other or the second electrodes 22 and the negative electrodes 32 bonded to each other therebetween. Therefore, good contact and firm bonding between the first electrode 21 and the positive electrode 31 and between the second electrode 22 and the negative electrode 32 may be ensured, and the bonded electrodes may be prevented from being detached from each other.

In some embodiments, as shown in FIG. 10, a width W1 of each first isolation pattern 4 in the first direction L is equal to a distance D1 between the positive electrode 31 and the negative electrode 32 adjacent to each other in the first direction L, and is greater than a distance D2 between the bodies 30 of any two adjacent functional devices 3 in the first direction L. Therefore, during the electrode bonding, the positive electrode 31 and the negative electrode 32 adjacent to each other may be in contact with the first isolation pattern 4 therebetween, and the first isolation pattern 4 may be in contact with the body 30 of the functional device 3, and the first isolation pattern 4 and the body 30 of the functional device 3 may be bonded to each other. In other words, each first isolation pattern 4 may be in contact with positive electrodes 31 and/or negative electrodes 32 adjacent to the first isolation pattern 4. Therefore, the flow of the melted electrodes may be well prevented, and a short circuit between the bonded electrodes may be prevented.

In some embodiments, as shown in FIG. 7, the positive electrode 31 and the negative electrode 32 adjacent to each other may be not in contact with the first isolation pattern 4 therebetween, and each of the positive electrode 31 and the negative electrode 32 adjacent to each other is spaced apart from the first isolation pattern 4 therebetween. In other words, each first isolation pattern 4 may be not in contact with positive electrodes 31 and/or negative electrodes 32 adjacent to the first isolation pattern 4. In this case, by presetting thicknesses of meltable sub-layers (or surface layers) of the bonding electrodes 2 and the electrodes of the functional devices 3, the melted electrodes can fill the space between the first isolation patterns 4. Therefore, the flow of the melted electrodes can be effectively prevented, and a short circuit between the bonded electrodes can be prevented. In addition, the first isolation patterns 4 can firmly clamp and fix the bonded bonding electrodes and the bonded electrodes of the functional devices. Furthermore, even if the surface of the carrier board carrying the functional devices is uneven and warped, good electrode bonding can be achieved.

An embodiment of the present disclosure further provides a method for manufacturing a display substrate. To avoid redundancy, differences between the method for manufacturing the display substrate in the embodiment and the method for manufacturing the display substrate in the previous embodiments are mainly described below.

In the present embodiment, in step S03, forming each of the plurality of functional devices may include forming a body, a positive electrode and a negative electrode. In this case, in step S04, coupling the electrodes of the plurality of functional devices to the plurality of bonding electrodes by bonding may include: aligning the positive electrodes and the negative electrodes with corresponding bonding electrodes of the plurality of bonding electrodes, respectively, adhering the base to the bodies by using the first isolation patterns as an adhesive, and coupling the positive electrodes and the negative electrodes to the corresponding bonding electrodes by bonding.

In some embodiments, the first isolation patterns may be used as the adhesive to adhere the base to the bodies by a laser curing process or a thermal crosslinking process. Therefore, the influence of the warpage of the carrier board carrying functional devices on the bonding of the electrodes can be avoided.

In some embodiments, the positive electrodes and the negative electrodes may be coupled to the corresponding bonding electrodes by bonding by a nitrogen tempering process. In the nitrogen tempering process, metal materials included in the surface layers of the positive electrodes and the negative electrodes which are at a relatively high level are melted, and flow onto the bonding electrodes which are at a relatively low level due to gravity to form a metal alloy with the bonding electrodes, and thus the electrodes (for example, the positive electrodes, the negative electrodes and the bonding electrodes) are bonded by the eutectic bonding process.

In the embodiments of present disclosure, the first isolation pattern can prevent the flow of the melted electrodes towards adjacent electrodes, and prevent a short circuit between adjacent bonding electrodes on the display substrate and between electrodes of adjacent functional devices. Furthermore, even if the surface of the carrier board carrying the functional devices is uneven and warped, the electrodes of the functional devices 3 can be well bonded to the bonding electrodes 2. Therefore, the electrode bonding quality of the display substrate is improved, and the quality of the display substrate is improved.

In some embodiments, the method for manufacturing the display substrate according to the present embodiment may further include a step S05. In step S05, the carrier board carrying the plurality of functional devices is stripped from the plurality of functional devices.

The display substrate according to the embodiments of the present disclosure may include any product or component having a display function, such as an LED substrate, an LED television, a display, a mobile phone, or a navigator.

It should be understood that the above embodiments are merely exemplary embodiments that are employed to illustrate the principles of the present disclosure, and that the present disclosure is not limited thereto. Various changes and modifications can be made by those skilled in the art without departing from the spirit and essence of the present disclosure, and should be considered to fall within the protection scope of the present disclosure.

What is claimed is:

1. A display substrate, comprising a base, a plurality of bonding electrodes arranged on the base in a plurality of rows and a plurality of columns and spaced apart from each other, a plurality of functional devices on a side of the plurality of bonding electrodes away from the base, and an isolation structure disposed on the base,
   wherein the plurality of bonding electrodes are coupled to positive electrodes and negative electrodes of the plurality of functional devices by bonding,
   wherein each row of bonding electrodes of the plurality of rows of bonding electrodes comprises a plurality of bonding electrodes arranged in a row direction, the isolation structure comprises a plurality of first isolation patterns extending in the row direction, and the plurality of first isolation patterns and the plurality of rows of bonding electrodes are alternately arranged in a column direction,
   wherein a width of each first isolation pattern in the column direction is equal to a distance between the positive electrode and the negative electrode adjacent to each other,
   wherein each functional device further comprises a body, and the positive electrode and the negative electrode protrude from a first surface of the body to an outside of the body,
   wherein the positive electrode and the negative electrode protrude outward from the first surface of the body by a same thickness, the plurality of rows of bonding electrodes have a same thickness in a vertical direction perpendicular to the row direction and the column direction, and a thickness of the plurality of first isolation patterns in the vertical direction, the thickness of the positive electrode and the negative electrode protruding outward from the first surface of the body, and the thickness of the plurality of rows of bonding electrodes in the vertical direction satisfy: $d1=(d2+d3)*[1+(P/W)]$, and
   where $d1$ is the thickness of the plurality of first isolation patterns in the vertical direction, $d2$ is the thickness of the plurality of rows of bonding electrodes in the vertical direction, $d3$ is the thickness of the positive electrode and the negative electrode protruding outward from the first surface of the body, $P$ is a warpage value of a carrier board carrying the plurality of functional devices, and $W$ is a width of the carrier board carrying the plurality of functional devices in the column direction.

2. The display substrate of claim 1, wherein
   the plurality of rows of bonding electrodes comprises a plurality of rows of first electrodes and a plurality of rows of second electrodes, each row of first electrodes of the plurality of rows of first electrodes comprises a plurality of first electrodes arranged in a row direction, each row of second electrodes of the plurality of rows of second electrodes comprises a plurality of second electrodes arranged in the row direction, and the plurality of rows of first electrodes and the plurality of rows of second electrodes are alternately arranged in a column direction such that each column of bonding electrodes of the plurality of bonding electrodes comprises a plurality of first electrodes and a plurality of second electrodes alternately arranged;
   and
   each first electrode is coupled to a corresponding positive electrode by bonding, and each second electrode is coupled to a corresponding negative electrode by bonding.

3. The display substrate of claim 1, wherein at least one first isolation pattern is in contact with a row of first electrodes and a row of second electrodes adjacent to the at least one first isolation pattern, and a cross section of at least one first isolation pattern perpendicular to the row direction comprises an inverted trapezium.

4. The display substrate of claim 3, wherein
   the positive electrode and the negative electrode protrude outward from the first surface of the body by a same thickness;
   the first electrode and the second electrode have a same thickness in a vertical direction perpendicular to the row direction and the column direction; and
   the thickness of the positive electrode protruding outward from the first surface of the body is greater than a thickness of the plurality of first isolation patterns in the vertical direction, and the thickness of the plurality of first isolation patterns in the vertical direction is greater than the thickness of the first electrode in the vertical direction.

5. The display substrate of claim 3, wherein
   a width of the positive electrode in the column direction is equal to a width of the negative electrode in the column direction;
   a width of the first electrode in the column direction is equal to a width of the second electrode in the column direction;
   the width of the positive electrode in the column direction is greater than or equal to the width of the first electrode in the column direction; and a distance between surfaces of at least two adjacent first isolation patterns away from the base in the column direction is smaller than the width of the first electrode in the column direction.

6. The display substrate of claim 3, wherein a surface of at least one first isolation pattern away from the base and a side surface of the at least one first isolation pattern adjacent to the surface of the at least one first isolation pattern away from the base form a chamfer, and the chamfer ranges from 45° to 90°.

7. The display substrate of claim 1, wherein a cross section of each first isolation pattern perpendicular to the row direction comprises a rectangle.

8. The display substrate of claim 7, wherein the width of each first isolation pattern in the column direction is greater than a distance between the bodies of any two adjacent functional devices in the column direction.

9. The display substrate of claim 1, wherein
the isolation structure further comprises a plurality of second isolation patterns disposed on the base and alternately arranged with the plurality of columns of bonding electrodes;
the plurality of second isolation patterns extend in the column direction and form a plurality of grooves by crossing the plurality of first isolation patterns, and the plurality of bonding electrodes are respectively located in the plurality of grooves; and
the plurality of second isolation patterns have a same shape as the plurality of first isolation patterns.

10. The display substrate of claim 1, wherein
each of the plurality of bonding electrodes comprises a first sub-layer and a second sub-layer sequentially stacked on the base, and the second sub-layer is melted when the bonding electrode is bonded; and
each of the electrodes of the plurality of functional devices comprises a third sub-layer protruding from a body of the functional device and a fourth sub-layer stacked on the third sub-layer, and the fourth sub-layer is melted when the electrode of the plurality of functional devices is bonded.

11. The display substrate of claim 10, wherein
each of the first sub-layer and the third sub-layer comprises one of titanium, copper, nickel, and a metal alloy formed by any two of them; and
each of the second sub-layer and the fourth sub-layer comprises one of gold, aluminum, tin, indium, and a metal alloy formed by any two or three of them.

12. A method for manufacturing a display substrate, comprising:
forming, on a base, a plurality of bonding electrodes spaced apart from each other and arranged in a plurality of rows and a plurality of columns;
forming an isolation structure on the base;
forming a plurality of functional devices; and
coupling positive electrodes and negative electrodes of the plurality of functional devices to the plurality of bonding electrodes by bonding,
wherein each row of bonding electrodes of the plurality of rows of bonding electrodes comprises a plurality of bonding electrodes arranged in a row direction, the isolation structure comprises a plurality of first isolation patterns extending in the row direction, and the plurality of first isolation patterns and the plurality of rows of bonding electrodes are alternately arranged in a column direction,
wherein each functional device further comprises a body, and the positive electrode and the negative electrode protrude from a first surface of the body to an outside of the body,
wherein the positive electrode and the negative electrode protrude outward from the first surface of the body by a same thickness, the plurality of rows of bonding electrodes have a same thickness in a vertical direction perpendicular to the row direction and the column direction, and a thickness of the plurality of first isolation patterns in the vertical direction, the thickness of the positive electrode and the negative electrode protruding outward from the first surface of the body, and the thickness of the plurality of rows of bonding electrodes in the vertical direction satisfy: $d1=(d2+d3)*[1+(P/W)]$, and
where d1 is the thickness of the plurality of first isolation patterns in the vertical direction, d2 is the thickness of the plurality of rows of bonding electrodes in the vertical direction, d3 is the thickness of the positive electrode and the negative electrode protruding outward from the first surface of the body, P is a warpage value of a carrier board carrying the plurality of functional devices, and W is a width of the carrier board carrying the plurality of functional devices in the column direction.

13. The method for manufacturing the display substrate of claim 12, wherein
forming the isolation structure comprises forming the plurality of first isolation patterns.

14. The method for manufacturing the display substrate of claim 13, further comprising:
performing a drying process on the plurality of first isolation patterns while performing the step of coupling the positive electrodes and the negative electrodes of the plurality of functional devices to the plurality of bonding electrodes by bonding.

15. The method for manufacturing the display substrate of claim 13, wherein
performing a drying process on the plurality of first isolation patterns, and then performing the step of coupling the positive electrodes and the negative electrodes of the plurality of functional devices to the plurality of bonding electrodes by bonding.

16. The method for manufacturing the display substrate of claim 12, wherein
forming the isolation structure comprises forming the plurality of first isolation patterns;
forming each of the plurality of functional devices comprises forming the body, the positive electrode and the negative electrode; and
coupling the positive electrodes and the negative electrodes of the plurality of functional devices to the plurality of bonding electrodes by bonding comprises:
aligning the positive electrode and the negative electrode with corresponding bonding electrodes of the plurality of bonding electrodes, respectively;
adhering the base to the body by using the first isolation pattern as an adhesive; and
coupling the positive electrode and the negative electrode to the corresponding bonding electrodes by bonding.

17. The method for manufacturing the display substrate of claim 16, wherein
coupling the positive electrode and the negative electrode to the corresponding bonding electrodes by bonding comprises: coupling the positive electrode and the negative electrode to the corresponding bonding electrodes by bonding by a nitrogen tempering process.

* * * * *